US008815401B2

(12) United States Patent
Kato et al.

(10) Patent No.: US 8,815,401 B2
(45) Date of Patent: *Aug. 26, 2014

(54) PREPREG AND LAMINATE

(75) Inventors: Yoshihiro Kato, Tokyo (JP); Takeshi Nobukuni, Tokyo (JP); Masayoshi Ueno, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 989 days.

This patent is subject to a terminal disclaimer.

(21) Appl. No.: 12/216,818

(22) Filed: Jul. 11, 2008

(65) Prior Publication Data

US 2009/0017316 A1   Jan. 15, 2009

(30) Foreign Application Priority Data

Jul. 12, 2007   (JP) .................................. 2007/183125

(51) Int. Cl.
| | | |
|---|---|---|
| *B32B 15/00* | (2006.01) | |
| *B32B 15/06* | (2006.01) | |
| *B32B 15/08* | (2006.01) | |
| *B32B 15/092* | (2006.01) | |
| *B32B 15/20* | (2006.01) | |
| *B32B 27/06* | (2006.01) | |
| *B32B 27/18* | (2006.01) | |
| *B32B 27/20* | (2006.01) | |
| *B32B 27/28* | (2006.01) | |
| *B32B 27/38* | (2006.01) | |
| *C08L 63/00* | (2006.01) | |
| *C08L 33/04* | (2006.01) | |
| *C08L 33/14* | (2006.01) | |
| *C08L 83/00* | (2006.01) | |
| *C08L 83/04* | (2006.01) | |
| *C08L 83/06* | (2006.01) | |

(52) U.S. Cl.
USPC ........... 428/418; 428/413; 428/446; 428/447; 428/450; 428/457; 523/457; 523/466; 525/523; 525/524; 525/528; 525/113; 525/390; 525/395; 525/396; 524/261

(58) Field of Classification Search
None
See application file for complete search history.

(56) References Cited

U.S. PATENT DOCUMENTS

| | | | | |
|---|---|---|---|---|
| 4,025,485 A * | 5/1977 | Kodama et al. | .............. | 524/729 |
| 4,594,134 A * | 6/1986 | Hanada et al. | .............. | 522/99 |
| 4,824,616 A * | 4/1989 | Shimizu et al. | .............. | 264/7 |
| 5,186,880 A * | 2/1993 | Gaku et al. | .............. | 264/236 |
| 5,492,945 A * | 2/1996 | Morita et al. | .............. | 523/212 |
| 5,538,793 A * | 7/1996 | Inokuchi et al. | ............... | 428/407 |
| 5,756,568 A * | 5/1998 | Morita et al. | ................. | 524/268 |
| 5,840,831 A * | 11/1998 | Hamachi et al. | .............. | 528/488 |
| 5,945,471 A * | 8/1999 | Morita et al. | ................. | 524/409 |
| 5,969,039 A * | 10/1999 | Kobayashi et al. | ........... | 524/837 |
| 6,156,831 A * | 12/2000 | Sase et al. | ..................... | 524/101 |
| 6,469,074 B1 * | 10/2002 | Hino et al. | ..................... | 523/466 |
| 6,616,984 B1 * | 9/2003 | Capote et al. | ................... | 427/510 |
| 6,706,793 B2 * | 3/2004 | Abu-Isa et al. | ................. | 524/409 |
| 6,838,490 B2 * | 1/2005 | Zhang et al. | ................... | 522/148 |
| 7,399,803 B2 * | 7/2008 | Morita et al. | ................. | 524/430 |
| 7,528,220 B2 * | 5/2009 | Sugano et al. | ................ | 528/422 |
| 7,601,429 B2 * | 10/2009 | Kato et al. | ...................... | 428/458 |
| 2001/0020071 A1 * | 9/2001 | Capote et al. | ................. | 525/524 |
| 2002/0113044 A1 * | 8/2002 | Gaku et al. | ............... | 219/121.71 |
| 2005/0019554 A1 * | 1/2005 | Orikabe et al. | ............... | 428/327 |
| 2005/0042466 A1 * | 2/2005 | Ohno et al. | ..................... | 428/457 |
| 2005/0096423 A1 * | 5/2005 | Jennrich et al. | .............. | 524/492 |
| 2006/0084787 A1 * | 4/2006 | Sugano et al. | ................ | 528/422 |
| 2006/0093824 A1 * | 5/2006 | Nozaki | ...................... | 428/411.1 |
| 2006/0099391 A1 * | 5/2006 | Tomioka et al. | .............. | 428/209 |
| 2006/0223921 A1 * | 10/2006 | Bauer et al. | ................... | 524/121 |
| 2008/0187763 A1 * | 8/2008 | Kato et al. | ..................... | 428/418 |
| 2012/0009836 A1 * | 1/2012 | Ueno et al. | ..................... | 442/59 |
| 2012/0018072 A1 * | 1/2012 | Ueno et al. | ..................... | 156/60 |
| 2013/0337269 A1 * | 12/2013 | Ohtsuka et al. | ............... | 428/418 |
| 2014/0073721 A1 * | 3/2014 | Yaginuma et al. | ............ | 523/451 |

FOREIGN PATENT DOCUMENTS

| | | | |
|---|---|---|---|
| CN | 1769344 | | 5/2006 |
| CN | 1803916 | | 7/2006 |
| EP | 0 647 672 | * | 4/1995 |
| JP | 63-030519 | * | 2/1988 |
| JP | 2001-234078 | * | 8/2001 |
| JP | 2002-097319 | | 4/2002 |
| JP | 2006-131743 | * | 5/2006 |
| JP | 2006-193607 | * | 7/2006 |
| JP | 2006-348187 | * | 12/2006 |
| JP | 2007-045984 | * | 2/2007 |

OTHER PUBLICATIONS

A Chinese Office Action (with translation) issued May 25, 2011 in corresponding Chinese Patent Application No. 200810132333.4.
Japanese Office Action issued Dec. 20, 2012 in Japanese Application No. 2008-176800, with English translation thereof.

* cited by examiner

*Primary Examiner* — Vivian Chen
(74) *Attorney, Agent, or Firm* — Wenderoth, Lind & Ponack, L.L.P.

(57) ABSTRACT

A prepreg for a printed wiring board, comprising a cyanate ester resin having a specific structure, a non-halogen epoxy resin, a silicone rubber powder as a rubber elasticity powder, an inorganic filler and a base material, which prepreg retains heat resistance owing to a stiff resin skeleton structure, has high-degree flame retardancy without the use of a halogen compound or a phosphorus compound as a flame retardant, and has a small thermal expansion coefficient in plane direction without using a large amount of inorganic filler, and a laminate comprising the above prepreg.

6 Claims, No Drawings

PREPREG AND LAMINATE

FIELD OF THE INVENTION

The present invention relates to a prepreg for a printed wiring board, a resin composition suitable for the prepreg, a laminate comprising the prepreg and a metal-clad laminate comprising the prepreg.

BACKGROUND OF THE INVENTION

Conventionally, FR-4 type laminates obtained by curing epoxy resins with dicyandiamide have been widely used for laminates for printed wiring boards. However, it is difficult to cope with a demand for high heat resistance by means of this technology. Cyanate ester resins are known as resins having excellent heat resistance for printed wiring boards. In recent years, prepregs comprising resin compositions containing bisphenol A type cyanate ester resins and other thermosetting resins or thermoplastic resins are widely used for laminates for semiconductor plastic packages.

The above bisphenol A type cyanate ester resins have excellent properties in terms of electrical characteristics, mechanical properties, chemical resistance and adhesive properties. However, the bisphenol A type cyanate ester resins are insufficient under severe conditions in terms of moisture resistance or heat resistance after moisture absorption in some cases. Therefore, studies of cyanate ester resins having other structures have been made for the purpose of further improvements in properties.

Phenol novolak type cyanate ester resins are mostly used as the cyanate ester resins having other structures (JP-A-11-124433). However, the phenol novolak type cyanate ester resins have small cyanate group equivalents and many unreacted cyanate groups are apt to remain at the time of curing because of their stiff skeleton structure. Therefore, the phenol novolak type cyanate ester resins are insufficient in terms of properties such as adhesion to metal foil, moisture resistance and heat resistance after moisture absorption.

Further, the use of naphthol aralkyl type cyanate ester resins has been also studied (JP-A-2007-45984). Resin compositions containing such cyanate ester resins can retain heat resistance owing to their stiff resin skeleton structure and curability is increased by decreasing reaction inhibition factors, so that the resin compositions have excellent properties such as moisture resistance and heat resistance after moisture absorption.

Furthermore, high integration, high functionalization and high-density packaging of semiconductors, which are widely used for electronic equipment, communication apparatuses and personal computers, have been increasingly accelerated. Semiconductor plastic packages unfold from QFP to area mounting type semiconductor plastic packages such as BGA and CSP. Further, high-functional semiconductor plastic packages such as MCP and SIP have appeared. As above, the form of semiconductor plastic packages is becoming various. Therefore, it is more strongly required than ever that laminates for semiconductor plastic packages have high reliability.

The coefficient of thermal expansion of semiconductor elements is 3 to 6 ppm/° C. It is smaller than the coefficient of thermal expansion of general printed wiring boards for semiconductor plastic packages. For this reason, when a semiconductor plastic package undergoes thermal shock, warping occurs in the semiconductor plastic package due to the difference in coefficient of thermal expansion between a semiconductor element and a printed wiring board for the semiconductor plastic package, which sometimes causes defective connection between the semiconductor element and the printed wiring board for the semiconductor plastic package or between the semiconductor plastic package and the printed wiring board mounted therein. It is necessary to develop laminates having a small thermal expansion coefficient in plane direction for decreasing the warping for the purpose of securing connection reliability.

As a method for decreasing the coefficient of thermal expansion of laminates, there is a method in which an inorganic filler is incorporated. When the amount of the inorganic filler to be incorporated is large, an obtained resin composition is fragile. This causes a deterioration in the quality of drilling processing performed for making through holes necessary for layer-to-layer connection of printed wiring boards. Further, a drill bit used for the drilling processing wears out in a very short period of time, which results in an extreme decrease in productivity of the drilling processing. As a means for lowering thermal expansion in plane direction, it is known that organic fillers having rubber elasticity are incorporated into varnishes containing epoxy resins (Japanese Patent No. 3173332, JP-A-8-48001, JP-A-2000-158589, JP-A-2003-246849 and JP-A-2006-143973). When the above varnishes are used, it is required to use bromic flame-retardants for rendering laminates flame-resistant.

Conventionally, bromic flame-retardants are used for imparting flame retardancy to laminates. However, resin compositions containing no halogen compound are desired in accordance with a recent growing interest in environmental issues. Further, phosphorus compounds have been studied instead of halogen flame-retardants. However, there is a danger that the phosphorus compounds generate toxic compounds such as phosphine at the time of combustion. Therefore, it is desired to develop laminates having flame retardancy and a low thermal expansion coefficient without halogen compounds and phosphorus compounds.

SUMMARY OF THE INVENTION

It is an object of the present invention to provide a prepreg and a laminate for printed wiring boards, each of which has high-degree flame retardancy without a halogen compound or a phosphorus compound and has a very small coefficient of thermal expansion in plane direction.

The present inventors have found the following. A resin composition containing a cyanate ester resin having a specific structure, a non-halogen epoxy resin, an inorganic filler and a rubber elasticity powder is improved in curability since reaction inhibition factors being due to the molecule structure of a conventional cyanate ester resin, or the like, are decreased. The above resin composition can retain heat resistance owing to the stiff resin skeleton structure of the cyanate ester resin. The above resin composition is excellent in flame retardancy although it is a halogen-free resin composition. The above resin composition has a low coefficient of thermal expansion even when the amount of an inorganic filler to be added, which extremely decreases the processability of laminates, is decreased. Furthermore, the present inventors have found that a laminate having higher flam retardancy and a very low coefficient of thermal expansion in plane direction is obtained by using a silicone rubber as the rubber elasticity powder and a fused silica as the inorganic filler. On the basis of these findings, the present inventors have completed the present invention.

According to the present invention, there is provided a resin composition containing a cyanate ester resin (A) represented by the formula (1), a non-halogen epoxy resin (B), a silicone rubber powder (C) and an inorganic filler (D),

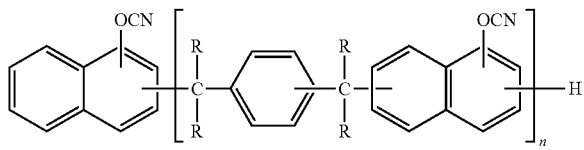
(1)

wherein R represents a hydrogen atom or a methyl group and n is an integer of at least 1.

In the above resin composition, the inorganic filler (D) is preferably a fused silica.

According to the present invention, further, there are provided a prepreg comprising the above resin composition and a base material (E), and a laminate and a metal-foil-clad laminate, each of which is obtained by curing the above prepreg.

Effect of the Invention

A cured product of the prepreg provided by the present invention has a high glass transition temperature, excellent heat resistance, high flame retardancy without the use of a halogen compound or a phosphorus compound, and a low coefficient of thermal expansion. Therefore, it is suitable as materials for semiconductor plastic packages, which are required to have high heat resistance and high reliability. When a semiconductor element is mounted in a printed wiring board for a semiconductor plastic package obtained from the prepreg, laminate or metal-foil-clad laminate provided according to the present invention, connection reliability is improved.

DETAILED DESCRIPTION OF THE INVENTION

The cyanate ester resin (A) represented by the formula (1) used in the present invention is obtained by condensation of a cyanic acid and a naphthol aralkyl resin which is obtained by a reaction of a naphthol such as α-naphthol or β-naphthol with p-xylyleneglycol, α,α'-dimethoxy-p-xylene, 1,4-di(2-hydroxy-2-propyl)benzene or the like. The method of producing the cyanate ester resin (A) is not specially limited. The cyanate ester resin (A) can be produced by any of methods known as a cyanate ester synthesis. Specifically, for example, the cyanate ester resin (A) is obtained by reacting a naphthol aralkyl resin represented by the formula (2) with a cyanogen halide in an inactive organic solvent in the presence of a basic compound. Further, it is possible to adopt a method in which a salt of a similar naphthol aralkyl resin and a basic compound is formed in a solution containing water and then the salt is reacted with a cyanogen halide in a two-phase interface reaction, thereby synthesizing the cyanate ester resin (A). n in the formula (1) is more preferably 10 or less. When n is 10 or less, a resin viscosity does not become high and impregnation into a base material is excellent so that the performance as a laminate is not impaired. Moreover, intramolecular polymerization hardly occurs at the time of synthesis and liquid-separability at the time of washing with water improves so that it is possible to prevent a decrease in yield.

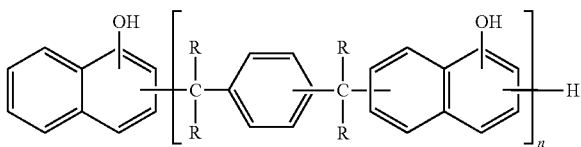
(2)

wherein R represents a hydrogen atom or a methyl group and n is an integer of at least 1.

The non-halogen epoxy resin (B) used in the present invention is not specially limited so long as it is a compound which has at least two epoxy groups in a molecule and intentionally does not have a halogen atom in a molecule structure. Examples thereof include a bisphenol A type epoxy resin, a bisphenol F type epoxy resin, a phenol novolak type epoxy resin, a cresol novolak type epoxy resin, a bisphenol A novolak type epoxy resin, a trifunctional phenol type epoxy resin, a tetrafunctional phenol type epoxy resin, a naphthalene type epoxy resin, a biphenyl type epoxy resin, an aralkyl novolak type epoxy resin, an alicyclic epoxy resin, a polyol type epoxy resin, glycidyl amine, glycidyl ester, a compound obtained by epoxidation of a double bond of butadiene or the like, and a compound obtained by a reaction of a hydroxyl-group-containing silicon resin with epichlorohydrin. In particular, an aralkyl novolak type epoxy resin is preferable in view of improvement in flame resistance. The aralkyl novolak type epoxy resin refers to a compound represented by the formula (3). Examples thereof include a phenol phenyl aralkyl type epoxy resin, a phenol biphenyl aralkyl type epoxy resin and a naphthol aralkyl type epoxy resin. The non-halogen epoxy resin (B) can be used singly or a mixture of at least two non-halogen epoxy resins (B) can be used, as required.

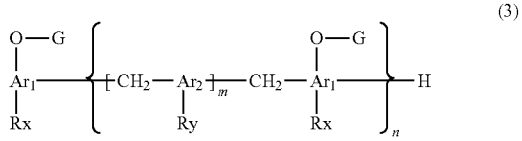
(3)

wherein G represents a glycidyl group, each of $Ar_1$ and $Ar_2$ represents an aryl group having as substituent a monocyclic or polycyclic aromatic hydrocarbon, such as a phenyl group, a naphthyl group or a biphenyl group, each of Rx and Ry represents a hydrogen atom, an alkyl group or an aryl group, m represents an integer of 1 to 5 and n represents an integer of 1 to 50.

In the present invention, it is preferred that the cyanate ester resin (A) and the non-halogen epoxy resin (B) are contained in the resin composition such that the ratio (CN/Ep) of the number of cyanate (CN) groups of the cyanate ester resin (A) and the number of epoxy (Ep) groups of the non-halogen epoxy resin (B) in the resin composition is 0.7 to 2.5. When CN/Ep is less than 0.7, a laminate decreases in flame retardancy. When it exceeds 2.5, curability decreases in some cases.

The silicone rubber powder (C) used in the present invention is a fine powder of an addition polymer of a vinyl-group-containing dimethyl polysiloxane and methylhydrogenpolysiloxane. Silicone rubber powders have strong cohesive property and the dispersibiliy thereof in resin compositions is poor in some cases. Therefore, it is preferred to use a silicone rubber powder which is improved in dispersibility by coating its surface with a silicone resin. The silicone resin used for the above surface coating is polymethylsilsesquioxane in which a siloxane bond is three-dimensionally reticulately cross-linked. The average particle diameter (D50) of the silicone rubber powder (C) is not specially limited. The average particle diameter (D50) is preferably 1 to 15 µm in view of dispersibility. The amount of the silicone rubber powder (C) is not specially limited. The amount of the silicone rubber powder (C) per 100 parts by weight of the total amount of the cyanate ester resin (A) and the non-halogen epoxy resin (B) is preferably 3 to 30 parts by weight and it is particularly preferably 3 to 20 parts by weight, since moldability or dispersibility decreases in some cases when it is too large.

Examples of the inorganic filler (D) used in the present invention include silicas such as natural silica, fused silica, amorphous silica and hollow silica, molybdenum compounds such as boehmite, molybdenum oxide and zinc molybdate, alumina, talc, calcined talc, mica, short glass fiber and spherical glass (fine powders of glasses such as E glass, T glass or D glass). Of these, the fused silica is preferred since it is excellent in low thermal expansion properties. The average particle diameter (D50) of the inorganic filler (D) to be used is not specially limited. The average particle diameter (D50) is preferably 0.2 to 5 µm in view of dispersibility. The amount of the inorganic filler (D) per 100 parts by weight of the total amount of the cyanate ester resin (A) and the non-halogen epoxy resin (B) is preferably 50 to 150 parts by weight and it is particularly preferably 50 to 140 parts by weight, since moldability decreases in some cases when the amount of the inorganic filler (D) is too large. The inorganic filler (D) may be used singly or a mixture of at least two inorganic fillers (D) may be used, as required.

A silane-coupling agent or a wetting and dispersing agent can be jointly used with the above inorganic filler (D). The silane-coupling agent is not specially limited so long as it is selected from general silane coupling agents which are used for surface-treating inorganic substances. Specific examples thereof include aminosilane coupling agents such as γ-aminopropyltriethoxysilane and N-β-(aminoethyl)-γ-aminopropyltrimethoxysilane, epoxysilane coupling agents such as γ-glycidoxypropyltrimethoxysilane, vinylsilane coupling agents such as γ-methacryloxypropyltrimethoxysilane, cationic silane coupling agents such as N-β-(N-vinylbenzylaminoethyl)-γ-aminopropyltrimethoxysilane hydrochloride, and phenylsilane coupling agents. The silane coupling agent can be used singly or at least two silane coupling agents can be used in combination, as required. The wetting and dispersing agent is not specially limited so long as it is selected from dispersion stabilizers which are used for coatings. For example, wetting and dispersing agents supplied by Big Chemie Japan, such as Disperbyk-110, 111, 180 and 161 and BYK-W996, W9010 and W903, can be used as the above wetting and dispersing agent.

The resin composition of the prepreg of the present invention can further contain a bismaleimide compound. The bismaleimide compound is not specially limited so long as it is a compound having two maleimide groups in a molecule. Specific examples thereof include bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane and bis(3,5-diethyl-4-maleimidophenyl)methane. Further, the bismaleimide compound can be incorporated in the form of a prepolymer of such bismaleimide compound or a prepolymer of such bismaleimide compound and an amine compound. The bismaleimide compound can be used singly or a mixture of at least two bismaleimide compounds can be used, as required. The bismaleimide compound is more preferably bis(4-maleimidophenyl)methane, 2,2-bis{4-(4-maleimidophenoxy)-phenyl}propane or bis(3-ethyl-5-methyl-4-maleimidophenyl)methane.

In the present invention, a silicone resin powder can be used as a flame retardant assistant, as required. The silicone resin powder is polymethylsilsesquioxane in which a siloxane bond is three-dimensionally reticulately cross-linked. The silicone resin powder retards a combustion time and improves a flame retardant effect and thus it functions as a flame retardant assistant. The amount of the silicone resin powder to be added is preferably 20 parts by weight or less per 100 parts by weight of the total amount of the cyanate ester resin (A) and the non-halogen epoxy resin (B).

The resin composition of the prepreg of the present invention can further contain a variety of high polymer compounds such as a different thermosetting resin, a thermoplastic resin, and oligomers and elastomers thereof, a different flame resistant compound or an additive, so long as the inherent properties of the resin composition are not impaired. These compounds and additive are not specially limited so long as these compounds and additive are selected from those which are generally used. Examples of the flame resistant compound include a nitrogen-containing compound such as melamine or benzoguanamine, and an oxazine-ring-containing compound. Examples of the additive include an ultraviolet absorber, an antioxidant, a photopolymerization initiator, a fluorescent brightening agent, a photosensitizer, a dye, a pigment, a thickener, a lubricant, an antifoamer, a dispersing agent, a leveling agent, a brightener and a polymerization inhibitor. These may be used in combination as required.

The base material (E) used in the present invention can be selected from known base materials which are used for a variety of printed wiring board materials. Examples thereof include glass fibers such as E glass, D glass, S glass, NE glass and T glass, inorganic fibers other than glass, and organic fibers such as polyimide, polyamide and polyester. It is possible to select the base material in accordance with intended use or performance as required. As for the form of the base material, a woven cloth, a nonwoven cloth, roving, a chopped strand mat or a surfacing mat is typically used. The thickness of the base material is not specially limited. The thickness of the base material is generally about 0.01 to 0.3 mm. Among these base materials, glass fibers are preferred in view of strength and water absorption properties. The substance of glass is particularly preferably T glass. The T glass is a substance of which the ingredient percentages of silica and alumina are higher than those of E glass. Table 1 shows comparison between the constitution of T glass and the constitution of E glass.

TABLE 1

|  | T glass | E glass |
|---|---|---|
| $SiO_2$ | 64-66 | 52-56 |
| $Al_2O_3$ | 24-26 | 12-16 |
| CaO | — | 20-25 |
| MgO | 9-11 | — |
| $B_2O_3$ | — | 5-10 |
| $Na_2O \cdot K_2O$ | — | 0-0.8 |
| etc. | | | unit: wt %

The resin composition of the prepreg of the present invention can further contain a curing accelerator, as required, in order to properly control the curing speed. The curing accelerator is not specially limited so long as it is a curing accelerator which is generally used for the cyanate ester resin (A) or the non-halogen epoxy resin (B). Specific examples of the curing accelerator include organic metal salts such as copper, zinc, cobalt and nickel, imidazoles and derivatives thereof, and tertiary amines.

A method of producing the prepreg of the present invention is not specially limited so long as it is a method in which the prepreg is produced by combining a resin composition containing as essential components a cyanate ester resin (A), a non-halogen epoxy resin (B), a silicone rubber powder (C) and an inorganic filler (D) with a base material (E) For example, a resin varnish containing the above resin composition is impregnated or applied into/to the base material (E) and then the impregnated or applied resin varnish is semi-cured by heating the resultant base material with the resin varnish in a dryer at 100 to 200° C. for 1 to 60 minutes, thereby producing the prepreg. With regard to the amount of the resin composition attached to the base material (E), the amount of the resin composition containing the resins (A) and (B), the silicone rubber powder (C) and the inorganic filler (D) in the prepreg is preferably 20 to 90% by weight.

An organic solvent can be used for the above resin varnish, if necessary. The organic solvent is not specially limited so long as it is compatible with a mixture of the cyanate ester resin (A) and the non-halogen epoxy resin (B). Specific examples thereof include ketones such as acetone, methyl ethyl ketone, methyl isobutyl ketone and cyclohexanone, aromatic hydrocarbons such as benzene, toluene and xylene and amides such as dimethylformamide and dimethylacetamide.

The laminate of the present invention is produced by carrying out laminate-molding using the above prepreg. Specifically, one prepreg as prepared above is placed or two or more prepregs as prepared above are stacked, metal foil(s) such as a copper foil or an aluminum foil are disposed on one surface or both surfaces of the prepreg or the stacked prepregs, as required, and the resultant set is laminate-mold, thereby producing the laminate. The metal foil to be used is not specially limited so long as it is selected from metal foils which can be used for printed wiring board materials. As for laminate-molding conditions, it is possible to adopt general means for laminates and multilayer boards for printed wiring boards. For example, a multiplaten press, a multiplaten vacuum press, continuous molding or an autoclave molding machine is generally used. The temperature is generally 100 to 300° C. The pressure is generally 2 to 100 kgf/cm². The period of time for heating is generally 0.05 to 5 hours. Further, post-curing can be carried out at 150 to 300° C., as required.

EXAMPLES

The present invention will be explained in detail with reference to Synthetic Examples, Examples and Comparative Examples hereinafter, while the present invention shall not be limited to these Examples.

Synthetic Example 1

Synthesis-1 of α-naphthol aralkyl type cyanate ester resin

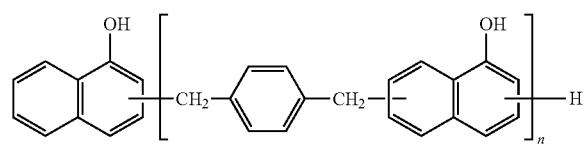

(4)

103 g (OH group 0.47 mol) of an α-naphthol aralkyl resin (SN485, OH group equivalent: 219 g/eq., softening point: 86° C., supplied by Nippon Steel Chemical Co., Ltd.) represented by the above formula (4) was dissolved in 500 ml of chloroform. Then, 0.7 mol of triethylamine was mixed with the resultant solution. The resultant mixture was dropwise added to 300 g of a chloroform solution of 0.93 mol of cyanogen chloride at −10° C. over 1.5 hours. The mixture was stirred for 30 minutes. Then, a mixed solution of 0.1 mol of triethylamine and 30 g of chloroform was further dropwise added to the stirred mixture, the mixture was stirred for 30 minutes, and the reaction was completed. A hydrochloride of triethylamine generated was separated by filtration. The thus-obtained filtrate was washed with 500 ml of 0.1 N hydrochloric acid. Then, washing with 500 ml of water was repeated four times. Then, a chloroform layer of the chloroform/water mixed solution was extracted by liquid-separation treatment. Sodium sulfate was added to the chloroform solution and dehydration treatment was carried out. The sodium sulfate was separated by filtration. Then, evaporation was carried out at 75° C. and degassing under reduced pressure was carried out at 90° C., thereby obtaining a brown solid α-naphthol aralkyl type cyanate ester resin represented by the formula (5). The absorption of a cyanate ester group was confirmed around 2264cm-1 in an infrared absorption spectrum. Further, the structure of the above cyanate ester resin was identified by 13C-NMR and 1H-NMR. The percentage of conversion from OH groups to OCN groups was 99% or more. Furthermore, the percentage of compounds having n of 1 to 4 was 93% on the basis of a differential refractive index detection by means of GPC.

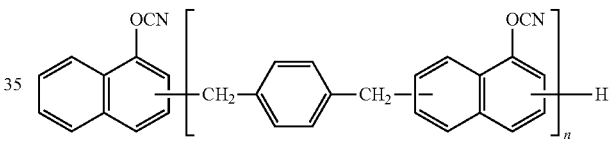

(5)

Synthetic Example 2

Synthesis-2 of α-naphthol aralkyl type cyanate ester resin

An α-naphthol aralkyl type cyanate ester resin was synthesized in the same manner as in Synthetic Example 1 except that 103 g (OH group 0.47 mol) of the α-naphthol aralkyl resin (SN485, OH group equivalent: 219 g/eq., softening point: 86° C., supplied by Nippon Steel Chemical Co., Ltd.) was replaced with 102 g (OH group 0.45mol) of an α-naphthol aralkyl resin (SN4105, OH group equivalent: 226g/eq., softening point: 105° C., supplied by Nippon Steel Chemical Co., Ltd.) and the amount of the cyanogen chloride was changed from 0.93 mol to 0.90 mol. The absorption of a cyanate ester group was confirmed around 2264cm-1 in an infrared absorption spectrum. Further, the structure of the above cyanate ester resin was identified by 13C-NMR and 1H-NMR. The percentage of conversion from OH groups to OCN groups was 99% or more. Furthermore, the percentage of compounds having n of 1 to 4 was75% on the basis of a differential refractive index detection by means of GPC.

Example 1

65 parts by weight of the α-naphthol aralkyl type cyanate ester resin (cyanate equivalent: 237 g/eq.) prepared in Synthetic Example 1, 30 parts by weight of a phenol biphenyl aralkyl type epoxy resin (NC-3000-FH, epoxy equivalent: 320 g/eq., supplied by Nippon kayaku Co., Ltd.) and 5 parts by weight of a naphthalene skeleton type epoxy resin (HP-4032D, epoxy equivalent: 140 g/eq., supplied by Dainippon Ink And Chemicals, Incorporated) were dissolved and mixed in methyl ethyl ketone, to obtain a solution. Further, 20 parts by weight of a silicone rubber powder (KMP-597, supplied by Shin-Etsu Chemical Co., Ltd.), 60 parts by weight of a spherical fused silica (SC-2050MB, supplied by ADMATECHS CO., LTD), 3 parts by weight of talc coated with zinc molybdate (Kemgard 911C, zinc molybdate support: 10% by weight, supplied by Sherwin Williams Chemicals) and 0.02 part by weight of zinc octylate were mixed with the solution, to obtain a varnish. The varnish was diluted with methyl ethyl ketone and then impregnated into an E glass woven cloth having a thickness of 0.1 mm, and the impregnated varnish was dried under heat at 160° C. for 4 minutes, thereby obtaining a prepreg having a resin content of 50% by weight.

Example 2

35 parts by weight of the α-naphthol aralkyl type cyanate ester resin (cyanate equivalent: 237 g/eq.) prepared in Synthetic Example 1, 15 parts by weight of bis(3-ethyl-5-methyl-4-maleimidophenyl)methane (BMI-70, supplied by K I KASEI KK) and 50 parts by weight of a phenol biphenyl aralkyl type epoxy resin (NC-3000-FH, epoxy equivalent: 320g/eq., supplied by Nippon kayaku Co., Ltd.) were dissolved and mixed in methyl ethyl ketone, to obtain a solution. Further, 3 parts by weight of a wetting and dispersing agent (disperbyk-161, supplied by BYK chemie Japan), 15 parts by weight of a silicone rubber powder having a surface coated with a silicone resin (silicone composite powder KMP-600, supplied by Shin-Etsu Chemical Co., Ltd.), 10 parts by weight of a silicone resin powder (Tospearl 120, supplied by Momentive Performance Materials Japan), 90 parts by weight of a spherical fused silica (SC-2050MOB, supplied by ADMATECHS CO., LTD) and 0.02 part by weight of zinc octylate were mixed with the solution, to obtain a varnish. The varnish was diluted with methyl ethyl ketone and then impregnated into an E glass woven cloth having a thickness of 0.1 mm, and the impregnated varnish was dried under heat at 160° C. for 4 minutes, thereby obtaining a prepreg having a resin content of 50% by weight.

Example 3

37 parts by weight of the α-naphthol aralkyl type cyanate ester resin (cyanate equivalent: 244 g/eq.) prepared in Synthetic Example 2, 25 parts by weight of bis(3-ethyl-5-methyl-4-maleimidophenyl)methane (BMI-70, supplied by K I KASEI KK), 38 parts by weight of a phenol biphenyl aralkyl type epoxy resin (NC-3000-FH, epoxy equivalent: 320 g/eq., supplied by Nippon kayaku Co., Ltd.) and 2 parts by weight of a silane coupling agent (Z6040, supplied by Dow Corning Toray Co., Ltd.) were dissolved and mixed in methyl ethyl ketone, to obtain a solution. Further, 3 parts by weight of a wetting and dispersing agent (BYK-W9010, supplied by BYK chemie Japan), 15 parts by weight of a silicone rubber powder having a surface coated with a silicone resin (silicone composite powder KMP-600, supplied by Shin-Etsu Chemical Co., Ltd.), 110 parts by weight of a spherical fused silica (SC-2050MR, supplied by ADMATECHS CO., LTD) and 0.02 part by weight of zinc octylate were mixed with the solution, to obtain a varnish. The varnish was diluted with methyl ethyl ketone and then impregnated into a T glass cloth having a thickness of 0.1 mm, and the impregnated varnish was dried under heat at 160 ° C. for 4 minutes, thereby obtaining a prepreg having a resin content of 50% by weight.

Example 4

45 parts by weight of the α-naphthol aralkyl type cyanate ester resin (cyanate equivalent: 244 g/eq.) prepared in Synthetic Example 2 and 55 parts by weight of a phenol phenyl aralkyl type epoxy resin (Xylok type epoxy resin, epoxy equivalent: 240 g/eq., supplied by Nippon kayaku Co., Ltd.) were dissolved and mixed in methyl ethyl ketone, to obtain a solution. Further, 3 parts by weight of a wetting and dispersing agent (disperbyk-161, supplied by BYK chemie Japan), 15 parts by weight of a silicone rubber powder having a surface coated with a silicone resin (silicone composite powder KMP-600, supplied by Shin-Etsu Chemical Co., Ltd.), 10 parts by weight of a silicone resin powder (Tospearl 120, supplied by Momentive Performance Materials Japan), 140 parts by weight of a spherical fused silica (SC-2050MR, supplied by ADMATECHS CO., LTD), 3 parts by weight of talc coated with zinc molybdate (Kemgard 911C, zinc molybdate support: 10% by weight, supplied by Sherwin Williams Chemicals) and 0.02 part by weight of zinc octylate were mixed with the solution, to obtain a varnish. The varnish was diluted with methyl ethyl ketone and then impregnated into an E glass woven cloth having a thickness of 0.1 mm, and the impregnated varnish was dried under heat at 160° C. for 4 minutes, thereby obtaining a prepreg having a resin content of 50% by weight.

Comparative Example 1

A prepreg was obtained in the same manner as in Example 4 except that 45 parts by weight of the α-naphthol aralkyl type cyanate ester resin (cyanate equivalent: 244 g/eq.) was replaced with 45 parts by weight of a prepolymer of 2,2-bis (4-cyanatophenyl) propane (BT2070, cyanate equivalent: 139 g/eq., supplied by Mitsubishi Gas Chemical Company, Inc.).

Comparative Example 2

A prepreg was obtained in the same manner as in Example 4 except that 140 parts by weight of the spherical fused silica (SC-2050MR, supplied by ADMATECHS CO., LTD) used in Example 4 was not used.

Comparative Example 3

40 parts by weight of a phenol novolak resin (TD2093, supplied by supplied by Dainippon Ink And Chemicals, Incorporated) and 60 parts by weight of a phenol novolak type epoxy resin (DEN438, supplied by Dow Chemical Japan Ltd.) were dissolved and mixed in methyl ethyl ketone to obtain a solution. Further, 15 parts by weight of a silicone rubber powder having a surface coated with a silicone resin (silicone composite powder KMP-600, supplied by Shin-Etsu Chemical Co., Ltd.) and 0.05 part by weight of 2-ethyl-4-methylimidazole were mixed with the solution to obtain a varnish. The varnish was diluted with methyl ethyl ketone and then impregnated into an E glass woven cloth having a thickness of 0.1 mm, and the impregnated varnish was dried under heat at 160° C. for 4 minutes, thereby obtaining a prepreg having a resin content of 50% by weight.

Comparative Example 4

A prepreg was obtained in the same manner as in Comparative Example 3 except that 15 parts by weight of the silicone rubber powder having a surface coated with a silicone resin (silicone composite powder KMP-600, supplied by Shin-Etsu Chemical Co., Ltd.) was replaced with 15 parts by weight of a core shell fine powder obtained by coating a core layer of a rubbery polymer made of an acrylic resin with a shell layer of a glassy polymer (STAPHYLOID AC-3832, supplied by GANZ Chemical Co., Ltd.) and 60 parts by weight of a spherical fused silica (SC-2050MB, supplied by ADMATECHS CO., LTD) was added.

Comparative Example 5

A prepreg was obtained in the same manner as in Example 4 except that 15 parts by weight of the silicone rubber powder having a surface coated with a silicone resin (silicone composite powder KMP-600, supplied by Shin-Etsu Chemical Co., Ltd.) used in Example 4 was not used.

Comparative Example 6

A prepreg was obtained in the same manner as in Example 1 except that 20 parts by weight of the silicone rubber powder having a surface coated with a silicone resin (silicone composite powder KMP-600, supplied by Shin-Etsu Chemical Co., Ltd.) used in Example 1 was not used and the amount of the spherical fused silica (SC-2050MB, supplied by ADMATECHS CO., LTD) was changed from 60 parts by weight to 160 parts by weight.

Preparation of Metal-foil-clad Laminate

Four prepregs obtained in Example 1 were stacked, 12 μm-thick electrolytic copper foils (3EC-III, supplied by Mitsui Mining and Smelting Co., Ltd.) were placed on the upper and lower surfaces of the stacked prepregs, one copper foil on the upper surface and one copper foil on the lower surface, and the resultant set was laminate-molded at a pressure of 30 kgf/cm$^2$ at a temperature of 220° C. for 120 minutes, to obtain a copper-clad laminate having an insulating layer thickness of 0.4 mm. The prepregs obtained in Examples 2 to 4 and Comparative Examples 1 to 6 were similarly processed, thereby obtaining copper-clad laminates each having an insulating layer thickness of 0.4 mm, respectively.

The above-obtained metal-foil-clad laminates were evaluated for flame retardancy, coefficient of thermal expansion and drilling processability. Table 2 shows the results thereof.

The evaluations of flame retardancy and coefficient of thermal expansion were carried out after etching and removing the copper foils of the metal-foil-clad laminates. These evaluations were carried out as follows.

Combustion test: The evaluation was carried out in compliance with the UL 94 vertical combustion test method.

Coefficient of thermal expansion: A metal-foil-clad laminate was temperature-increased with a thermomechanical analyzer (supplied by TA Instruments) from 40° C. to 340° C. at a temperature-increasing rate of 10° C./min. The laminate was measured for a linear expansion coefficient in plane direction from 60° C. to 120° C. The measurement was carried out in both directions of longitudinal direction (Y) and lateral direction (X) of a glass cloth.

With regard to the evaluation of the drilling processability, the number of hits at the time of breakage of a drill bit was examined on the basis of the following drilling processing conditions.

Processor: ND-1 V212 supplied by Hitachi Via Mechanics, Ltd.

Number of lamination: Two metal-foil-clad laminates.

Entry sheet: LE808F3 supplied by Mitsubishi Gas Chemical Company, Inc.

Backup board: PS-1160D supplied by Risho Kogyo Co., Ltd.

Drill bit: MD 0.105×1.6 J492B supplied by UNIONTOOL Co.

Number of revolutions: 160 krpm.

Feed speed: 0.8 m/min.

Number of hits: 3,000.

TABLE 2

| | Example 1 | Example 2 | Example 3 | Example 4 |
|---|---|---|---|---|
| Coefficient of thermal expansion in Y direction | 10.6 | 10.3 | 8.2 | 10.2 |
| Coefficient of thermal expansion in X direction | 11.3 | 11.0 | 8.7 | 10.7 |
| Flame retardancy | V-0 | V-0 | V-0 | V-0 |
| Number of hits at the time of breakage of drill bit | >3,000 No breakage | >3,000 No breakage | 2,432 | >3,000 No breakage |

| | CEx. 1 | CEx. 2 | CEx. 3 | CEx. 4 | CEx. 5 | CEx. 6 |
|---|---|---|---|---|---|---|
| Coefficient of thermal expansion in Y direction | 10.4 | 10.5 | 10.3 | 10.7 | 12.0 | 10.5 |
| Coefficient of thermal expansion in X direction | 11.1 | 11.0 | 10.9 | 11.8 | 12.9 | 11.3 |
| Flame retardancy | V-1 | V-1 | Entirely burn | Entirely burn | V-1 | V-0 |
| Number of hits at the time of breakage of drill bit | >3,000 No breakage | >3,000 No breakage | >3,000 No breakage | >3,000 No breakage | 2,319 | 1,642 | unit Coefficient of thermal expansion: ppm/° C.,
CEx. = Comparative Example.

Table 2 shows that Examples 1 to 4 according to the present invention were excellent in flame retardancy over Comparative Example 1 which used the prepolymer of 2, 2-bis (4-cyanatophenyl) propane, Comparative Example 2 which did not use the fused silica, Comparative Examples 3 and 4 relating to phenol curable resin compositions and Comparative Example 5 which did not use the silicone rubber powder having a surface coated with a silicone resin. Further, Table 2 shows that the coefficients of thermal expansion in Examples 1 to 4 were lower than that in Comparative Example 5 which did not use the silicone rubber powder having a surface coated with a silicone resin used in Example 4. In comparison between Comparative Example 6 in which the coefficient of thermal expansion was decreased by increasing the amount of inorganic filler and Examples 1, 2 and 4 each of which used the same E glass woven cloth as the E glass woven cloth used in Comparative Example 6, Table 2 shows that the life of drill bit in Comparative Example 6 was shorter than those in Examples 1, 2 and 4 so that the drilling processability decreased in Comparative Example 6. Therefore, it has been confirmed that the laminate comprising the prepreg obtained according to the present invention has a low thermal expansion coefficient in plane direction even when the amount of an inorganic filler, which remarkably decreases the processability of a laminate, is small and that it can attain flame retardancy of UL94V-0 without using a halogen flame retardant and a phosphorus compound as a flame retardant.

What is claimed is:

1. A resin composition comprising a cyanate ester resin (A) represented by the formula (1), a non-halogen epoxy resin (B), a silicone rubber powder (C) consisting of a polymer obtained by addition polymerization of a vinyl-group-containing dimethyl polysiloxane with methylhydrogenpolysiloxane, and an inorganic filler (D),

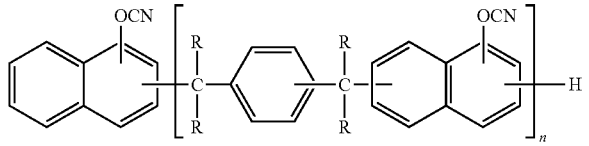
(1)

wherein R represents a hydrogen atom or a methyl group and n is an integer of at least 1, and wherein:
a ratio (CN/Ep) of a number of cyanate groups of the cyanate ester resin (A) and a number of epoxy groups of the non-halogen epoxy resin (B) in the resin composition is 0.7 to 2.5, an amount of the silicone rubber powder (C) per 100 parts by weight of a total amount of the cyanate ester resin (A) and the non-halogen epoxy resin (B) is 3 to 30 parts by weight, and an amount of the inorganic filler (D) per 100 parts by weight of the total amount of the cyanate ester resin (A) and the non-halogen epoxy resin (B) is 50 to 100 parts by weight.

2. The resin composition according to claim 1, wherein the inorganic filler (D) is a fused silica.

3. The resin composition according to claim 1, which further contains a bismaleimide compound (F).

4. A prepreg comprising the resin composition as defined in claim 1 and a base material (E).

5. A laminate obtained by curing the prepreg as defined in claim 4.

6. A metal-foil-clad laminate obtained by curing a laminate material comprising the prepreg as defined in claim 4 and a metal foil.

* * * * *